United States Patent
Burstein

(10) Patent No.: US 9,341,661 B2
(45) Date of Patent: *May 17, 2016

(54) TONE DETECTOR

(71) Applicant: Skyworks Solutions, Inc., Woburn, MA (US)

(72) Inventor: Amit Burstein, Westford, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 479 days.

This patent is subject to a terminal disclaimer.

(21) Appl. No.: 13/769,169

(22) Filed: Feb. 15, 2013

(65) Prior Publication Data

US 2013/0229170 A1 Sep. 5, 2013

Related U.S. Application Data

(63) Continuation of application No. 11/810,507, filed on Jun. 5, 2007, now Pat. No. 8,379,838.

(51) Int. Cl.
*G01R 29/00* (2006.01)
*H03K 5/19* (2006.01)

(52) U.S. Cl.
CPC . *G01R 29/00* (2013.01); *H03K 5/19* (2013.01)

(58) Field of Classification Search
CPC ..... G01R 31/31725; G01R 31/26; H03K 5/19
USPC .......................................... 324/76.57; 327/20
See application file for complete search history.

(56) References Cited

U.S. PATENT DOCUMENTS

| 4,042,790 | A | * | 8/1977 | Richards ........................ 379/351 |
| 4,405,837 | A | | 9/1983 | Ecklund |
| 4,410,762 | A | | 10/1983 | Ecklund |
| 4,434,504 | A | * | 2/1984 | Fredrickson .................. 455/403 |
| 4,446,334 | A | * | 5/1984 | Groff ............................. 379/188 |

(Continued)

FOREIGN PATENT DOCUMENTS

| DE | 196 23 930 | 12/1997 |
| GB | 2 294 168 | 4/1996 |

(Continued)

OTHER PUBLICATIONS

Tony van Roon, A Phase-Locked Loops Tutorial@, Copyright Aug. 2001, Last update: Jun. 4, 2003, pp. 1-11.

(Continued)

*Primary Examiner* — Arleen M Vazquez
*Assistant Examiner* — Robert P Alejnikov, Jr.
(74) *Attorney, Agent, or Firm* — Weide & Miller, Ltd.

(57) ABSTRACT

A tone detector is disclosed that is realizable in digital embodiment on a single integrated circuit die and does not require external components, such as a discrete capacitor. An input connects to a comparator, which in turn connects to one or more edge detectors and a flip flop. The edge detector outputs a pulse responsive to a detected edge. A counter is reset by the pulses from the edge detectors thereby preventing the counter from reaching a maximum value, which would otherwise be output from the counter and provided to a flip flop to clock in the comparator output at the D input to the flip flop. In operation, the comparator generates a rail to rail signal responsive to a received tone, which in turn is clocked through the flip flop as a logic high output indicating presence of a tone.

19 Claims, 8 Drawing Sheets

(56) References Cited

U.S. PATENT DOCUMENTS

| | | | |
|---|---|---|---|
| 4,896,122 | A | 1/1990 | Tahernia et al. |
| 4,987,606 | A | 1/1991 | Ozeki et al. |
| 5,119,322 | A | 6/1992 | Stroobach |
| 5,179,353 | A | 1/1993 | Miyake |
| 5,452,290 | A | 9/1995 | Mihm, Jr. |
| 5,471,507 | A | 11/1995 | Awata et al. |
| 5,535,247 | A | 7/1996 | Gailus et al. |
| 6,108,527 | A | 8/2000 | Urban et al. |
| 6,122,652 | A * | 9/2000 | Jin et al. .................. 708/312 |
| 6,424,925 | B1 | 7/2002 | Ku et al. |
| 7,003,274 | B1 | 2/2006 | Olip |
| 8,350,596 | B1 * | 1/2013 | Soh ............... H03K 5/1534 327/20 |
| 2002/0039894 | A1 | 4/2002 | Yoshida et al. |
| 2007/0172010 | A1 * | 7/2007 | Hilgendorf et al. ........... 375/371 |
| 2010/0027747 | A1 * | 2/2010 | Mott ............................. 378/82 |

FOREIGN PATENT DOCUMENTS

| | | |
|---|---|---|
| GB | 2 389 253 | 12/2003 |
| JP | 06-338793 | 12/2006 |
| WO | WO 99/25064 | 5/1999 |
| WO | WO 02/084935 | 10/2002 |

OTHER PUBLICATIONS

Ron Bertrand, A Supplementary Reading for 27—Oscillators—The Basics of PLL Frequency Synthesis@, Online Radio & Electronics Course, Copyright Aug. 1999-2002, Last revision: Apr. 2002, pp. 1-9.

A Technical Brief SWRA029—Fractional/Integer-N PLL Basics@, Texas Instruments Wireless Communication Business Unit, Aug. 1999, pp. 1-9 and 23-35.

Daniel Abramovitch, "Phase-Locked Loops: A Control Centric Tutorial", Agilent Laboratories, 2002, pp. 1-15.

Danny Abramovitch, APhase-Locked Loops: A Control Centric Tutorial@, Agilent Laboratories, May 8, 2002, pp. 1-20 and 31-34.

\* cited by examiner

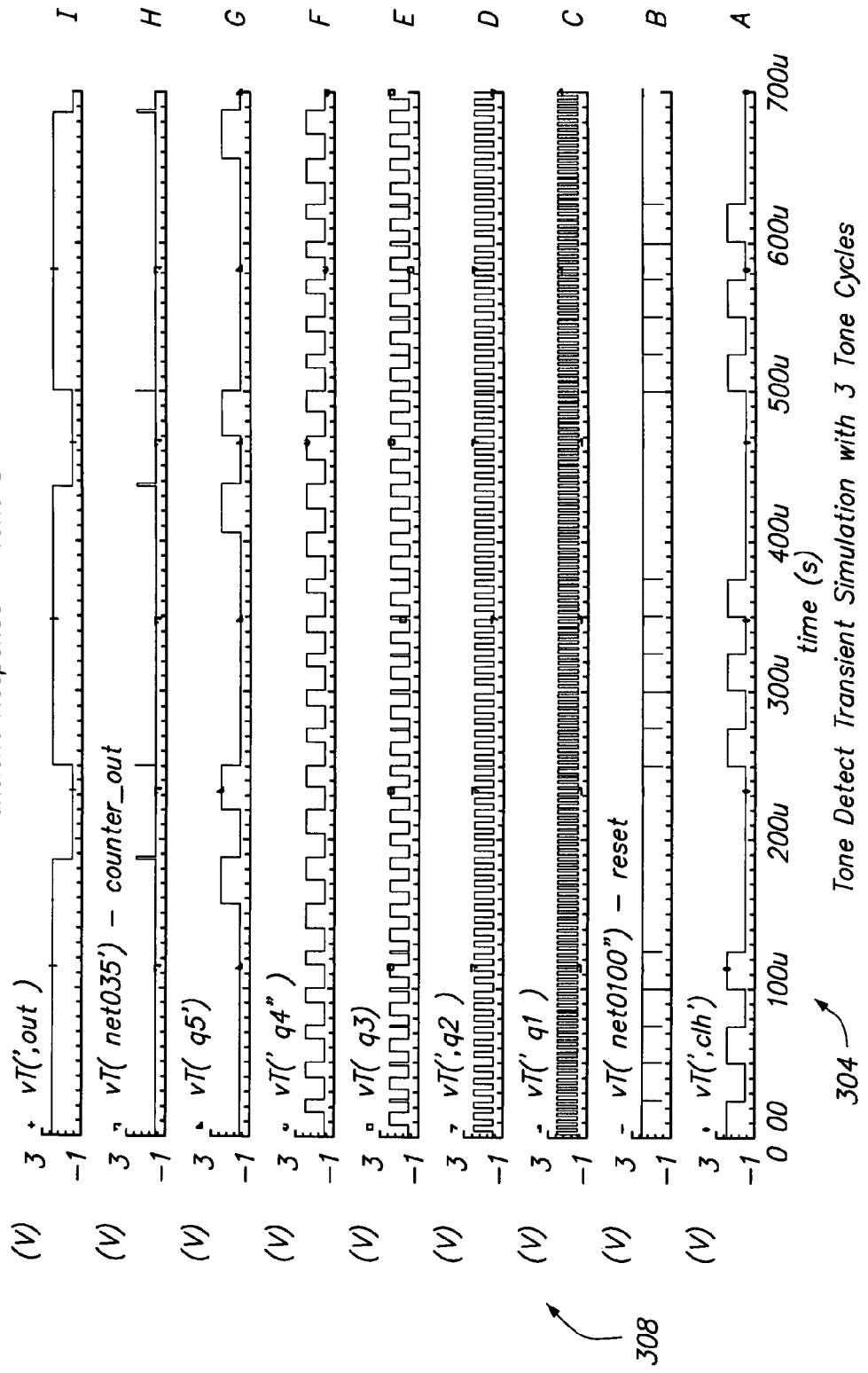

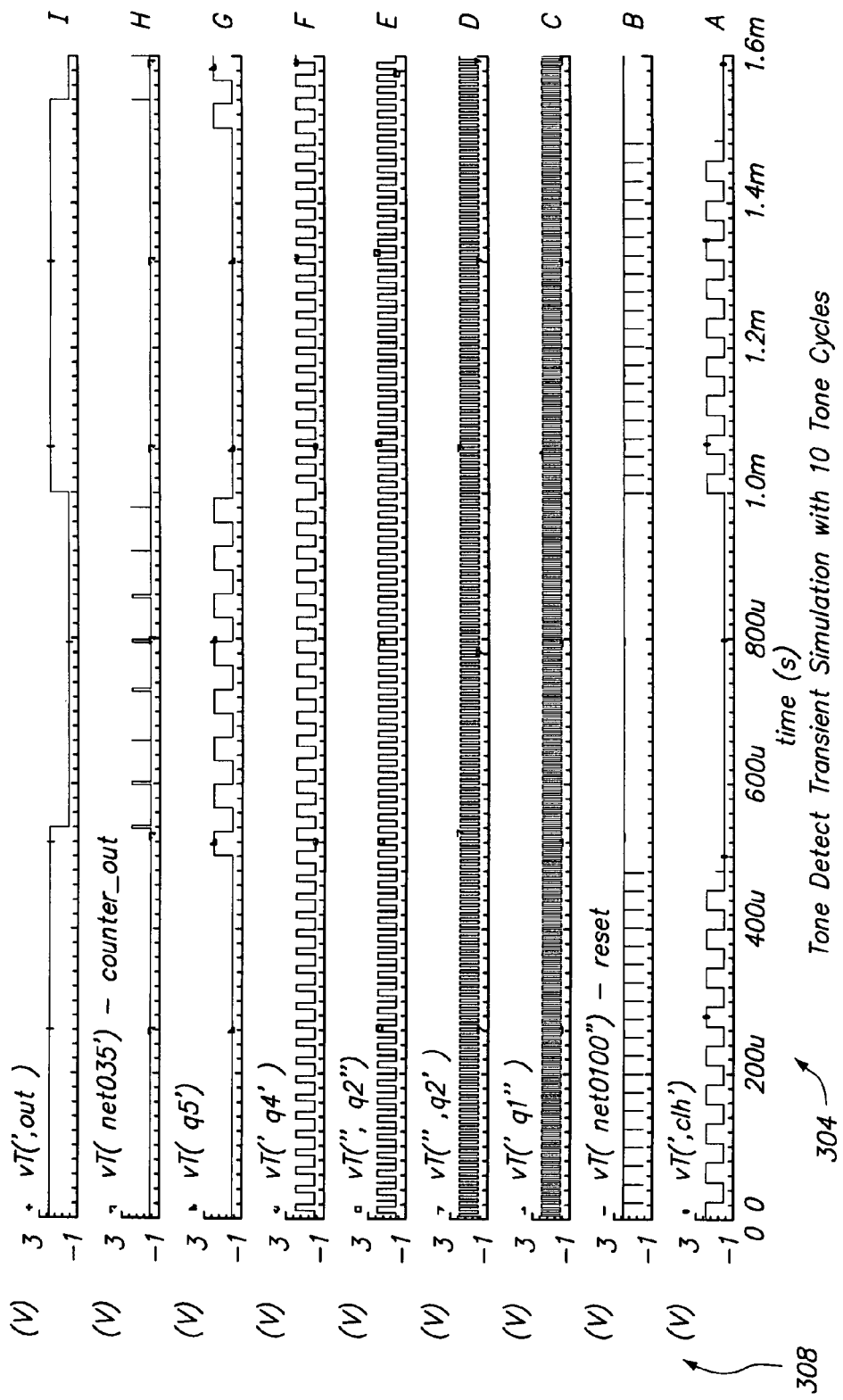

TONE DETECTOR

1. Priority Claim

This application is a continuation of and claims priority to U.S. patent application Ser. No. 11/810,507 filed on Jun. 5, 2007, which is now allowed and is set to issue as U.S. Pat. No. 8,379,838 on Feb. 19, 2013.

2. Field of the Invention

The invention relates to a tone detector, and in particular to a digital tone detector configured to detect an analog AC signal.

3. Related Art

Numerous electronic devices, and communication devices in particular, utilized tone detection. As such the various applications for tone detection within electronic circuits is well understood in the art and not discussed in detail herein. In the numerous different applications, tone detection circuits are configured to monitor for an incoming signal such as any AC signal, or a particular tone. Although numerous applications utilized tone detectors, one such application comprises switch control in direct broadcast satellite TV receivers.

While numerous different solutions have been proposed, such prior art solutions utilize multi-chip solutions which are enabled as a peak detector using diodes, amplifiers and one or more capacitors. Often, these solutions were in a bi-polar process.

As can be appreciated, multi-chip solutions are often undesirable due to the increased cost and space consumed by such a configuration. In addition, solutions utilizing capacitors often consume undesirable large amounts of space and cost, particularly if the capacitors must be located as discrete devices. These drawbacks may be exacerbated if the tone at issue is a low frequency tone, such as in the 10 to 25 KHz range which may require larger off-die capacitors.

Another proposed prior art method for tone detection utilizes filtering, such as band pass and low pass filters to isolate and detect the desired signal or tone. However, this method may only be suitable for select signals within a frequency bands which match the filters. Thus, signals outside of the filter's pass band may not be detected by such a system limiting the application of such an implementation. In addition, for low frequency tone detection, filter based detection requires external components, which are not integratable. Like prior solutions, this increases cost, size, and complexity.

Other proposed solutions utilized digital filtering techniques and Fourier transforms to monitor an input for a tone. While these proposed solutions may accurately detect the tone(s) at issue, such solutions are overly complex and consume large amounts of power and die space.

As a result, there is a need in the art for a tone detector which overcomes the drawbacks of the prior art. The tone detector disclosed herein overcomes the drawbacks associated with prior art solutions and provides additional benefits as are disclosed herein.

SUMMARY

To overcome the drawbacks in the prior art, a tone detector is disclosed that comprises a comparator configured to connect to an input. The input intermittently receives a tone signal and the comparator generates a square wave output signal in response to a tone signal. Also part of this embodiment of the tone detector is one or more edge detectors configured to detect an edge of the square wave signal and responsive to detection of an edge, generate a reset signal. A counter is present and configured to generate a maximum value signal unless reset by receipt of the reset signal prior to reaching a maximum counter value. Also part of this embodiment is a flip flop configured to receive the square wave signal and the maximum value signal. In this embodiment, the flip flop outputs a first signal when a tone signal is not present at the input and a second signal when a tone signal is present at the input. In this manner, an input is monitored and a received signal is processed, if present. An output is generated indicating where a tone is present and its duration.

In one embodiment, the counter comprises a programmable counter configured to count to a value n, where the value n is programmable. In addition, the flip flop, responsive to the maximum value signal, may output the first signal after the counter outputs the maximum counter value signal. In one configuration, the one or more edge detectors comprise a first edge detector configured to detect a rising edge and a second edge detector configured to detect a falling edge. The second edge detector may be paired with an inverter. It is also contemplated that in one embodiment, this detector further comprises a logic element configured to receive the maximum value signal and an output from the one or more edge detectors and generate a flip flop clicking signal in response thereto.

Also disclosed herein is a method for detecting a tone. This example method comprises monitoring an input for receipt of a tone signal and responsive to no tone signal being present, generating a maximum value with a counter. In this exemplary method, the maximum value is clocked through a flip flop as a first output signal indicating a tone is not present at the input. Then, responsive to receipt of a tone signal, this method of operation generates a rail to rail signal representing the tone signal and provides the rail to rail signal to a flip flop and one or more edge detectors. This method then clocks out a second output signal from the flip flop responsive to the rail to rail signal. At this stage, the method detects one or more edges of the rail to rail signal and responsive to detection, generates a counter reset signal. Thereafter, the method resets a counter responsive to the counter reset signal. The step of resetting the counter prevents generation of the maximum value signal.

In one embodiment, the rail to rail signal comprises a digital signal. It is contemplated that the rail to rail signal may be generated by a comparator. As described herein, the step of detecting one or more edges of the rail to rail signal may comprise detecting a rising edge, a falling edge, or both. For example, the detecting of one or more edges comprise detecting a rising edge with an edge detector and detecting a falling edge with an inverter and edge detector pair. In one embodiment, the method further comprises performing a logic function on the maximum value signal and an edge detector output and providing the output of the logic function to the flip flop. It is also contemplated that the method may further comprise programming the counter with a maximum value.

Other systems, methods, features and advantages of the invention will be or will become apparent to one of ordinary skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 3 illustrates multiple signal plots for signals generated by and within the example embodiment of FIG. 2.

FIG. 4 illustrates multiple signal plots for signals generated by and within the example embodiment of FIG. 2.

DETAILED DESCRIPTION

Before discussing the various different embodiments and methods of operation of the system disclosed herein, a discussion of exemplary example environments is provided. As is understood, tone detectors are commonly utilized in numerous different electronic devices. Communication devices in particular, such as receivers and transmitters often rely on tone detectors to achieve desired operation.

One example environment of use is in a satellite TV receiver or decoder, such as for example a set top box. While a tone detector may be utilized in numerous different application within the satellite receive, one particular use is in the detection of a specific tone or a set of tones in a receiver to indicate a request for frequency tuning band change.

Using the method and apparatus disclosed herein, solutions that previously required a multi-die implementation may be achieved with a single integrated circuit on a single die. Moreover, these single die solutions may be realized in reliable and easily realized process, such as CMOS.

In addition, numerous communication applications utilize tone detectors. By way of example and not limitation, tone detectors are used in facsimile operation, and caller identification and related services, such as CAS tones. Tone detectors as described herein may also be adopted for use for DTMF type tone detection. Communication modems, such as POTS type modems, or DSL/Cable modems, may also utilized tone detectors as described herein. The tone detector described herein may also be utilized in other environments of use, such as CTCSS in 2-way radios, Morse Code, light curtain, a presence detector, such as for garage door or industrial machinery, and proximity detectors.

In addition, although the tone detector described herein may be utilized to detect tones of any frequency, if so configured, in one configuration the tone in question is at the 10 KHz to 25 KHz range. Another, more narrow range is 18 KHz to 22 KHz range. In such an implementation, even when detecting such low frequencies, use of off-die capacitors may be avoided which is understood to provide a benefit.

It should be appreciated that the tone detector and method of operation described herein may be utilized in any environment of use and as such, the tone detector is not limited to use with satellite tuning or frequency specific applications.

Figure 1:
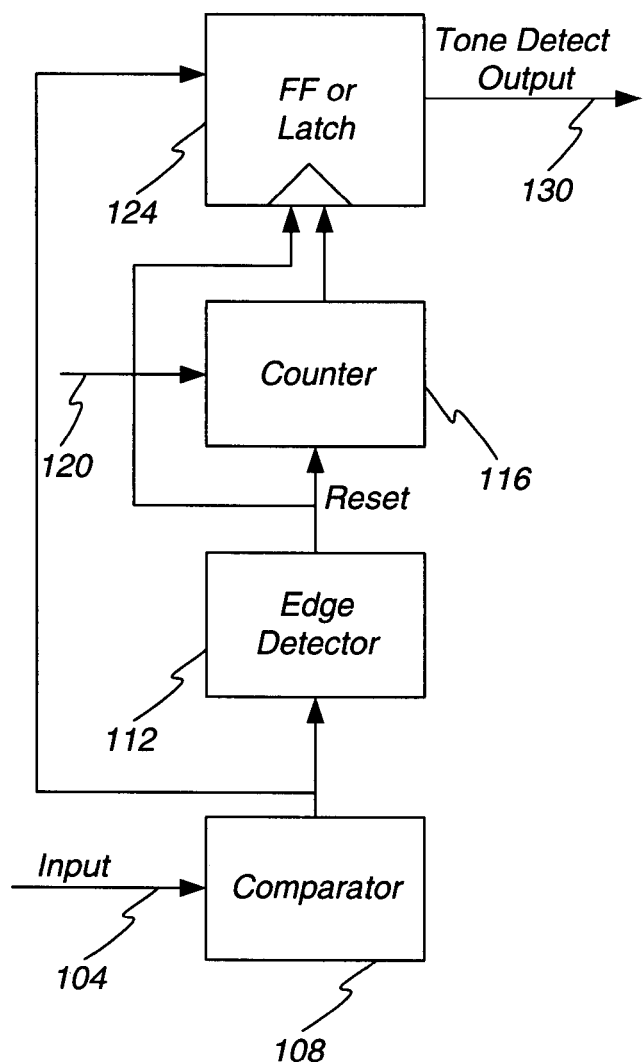
FIG. 1 illustrates a block diagram of an exemplary tone detector.

In reference to FIG. 1, a generalized block diagram of an example embodiment of the tone detector is shown. In this example embodiment, an input signal is provided, via an input 104 to comparator 108. The input may comprise an AC signal. In this embodiment, the comparator 108 operates to convert the input signal to a digital signal or a rail to rail signal. The comparison, performed by the comparator 108, may comprise a conversion of the received AC signal to a digital signal. In other embodiments the comparator 108 may comprise an input filter followed by a level sensitive comparator to select a desired frequency while rejecting unwanted frequencies or noise. As could be designed by one of ordinary skill in the art, numerous various circuits could be designed and enabled which convert an AC signal, i.e. tone, to a digital signal. It is contemplated that the comparator 108 could comprise any such circuit or system.

As a result of the processing by the comparator 108, the output of the comparator 108 comprises a digital signal or peak to peak signal as related to a reference voltage, which is in turn provided to an edge detector 112. The edge detector 112 is generally understood in the art and hence is not described in detail herein. In this embodiment the edge detector 112 monitors the received digital signal and, upon detection of an edge, such as a rising edge, a falling edge, or both, generates an output pulse indicative of the detected edge. The output pulse, resulting for a detected edge, is routed to a counter 116 and serves as reset signal to the counter.

The counter 116 operates as is understood in the art to monitor for input pulses, and upon receipt of sufficient pulses on input 120, the counter generates an output, in this embodiment, to a flip-flop or latch element 124. The counter 116 includes a re-set input which selectively provides a reset signal to the counter 116. In this embodiment the reset signal is from the edge detector 112. The reset signal may be received from any source, including but not limited to the edge detector, a controller or a processor. The reset signal resets the counter, thereby preventing or delaying the counter from reaching and outputting the counter's maximum value. This in turn prevents the counter output to the flip flop or latch element 124.

In this embodiment, the flip-flop or latch element 124 is configured to generate a high level digital output signal on the output 130 when a tone is present at the input 104. The flip flop or latch element 124 also receives the edge detector output as shown as an input. When a tone signal is present at the input 104, the edge detector 112 provides a clock edge to the flip-flop 124. When no tone signal is present at the input 104, the counter 116 will reach its maximum count providing a clock edge to the flip-flop 124.

A high level output from the flip-flop or latch element 124 indicates a tone is detected and is being received on input 104. In contrast, absence of a digital high level at the output 130 indicates that a tone is not present on the input 104.

FIG. 2 illustrates an example implementation of a tone detector. This is but one possible implementation and as such, it is contemplated that other implementations may be enabled without deviation from the claims that follow. In this example embodiment, an input tone is provided to the tone detector circuit on an input 204. The input 204 connects to a comparator 212. In this example embodiment the comparator 212 comprises a differential amplifier 216 having opposing terminals connected to opposing FETs 220 as shown. The FETs 220 connect to $V_{dd}$ and $V_{ss}$, where $V_{dd}$ represents the positive supply voltage or positive feed and $V_{ss}$ represents ground or the negative feed from the supply. The operation of a comparator is generally understood.

The comparator 212 compares the incoming signal to a reference voltage, and generates a rail to rail output signal corresponding or related to the tone frequency. In this configuration, the rail to rail signal swings between $V_{dd}$ and $V_{ss}$.

In one sense, the output of the comparator 212 comprises a digital signal which swings between each rail. In one embodiment, the signal is a square wave type signal having rising edges and falling edges which are typical of square wave signals and have detectable edges.

The output of the comparer 212 feeds into edge detectors 240A, 240B and a flip flop 244. In this embodiment, the edge detector 240B is preceded by an inverter 236 as shown which inverts the signal provided to the edge detector 240B. The edge detectors 240A, 240B detect the rising edge of received signals. Because an inverter 236 is in series prior to the edge detector 240B, the edge detector 240B detects what is actual the falling edge of the output of the comparator 212. The outputs of the edge detectors 240A, 240B, feed into an edge combiner and reset unit 250. The outputs from the detectors 240A, 240B may comprise any type signal, such as but not limited to short pulses. The output of the edge detector 240A also feeds into a logic element 254, which in this example embodiment comprises an OR gate.

The edge detectors 240A, 240B generate an output signal, such as for example, a pulse, upon detection of a rising edge. Due to the inverter 236, the edge combiner and reset unit 250 receives an input signal or pulse in response to rising or falling edges from the comparator 212. The inverter 236 and edge detector 240B may be replaced by a falling edge, edge detector. In is also contemplated that inverter 236 and edge detector 240B may be eliminated, but such an embodiment will require a counter 258 with a higher maximum count value due to detection of only the rising edges of the comparator output signal. For example, if the inverter 236 and edge detector 240B were not present, then the counter 258 would have be configured with double the maximum count value to maintain identical operation.

The edge combiner and reset unit 250 monitors for incoming signals from the detectors 240A, 240B and, upon receipt of an incoming signal, responsive to edge detection, generates an output pulse. In one embodiment, the edge detector and reset unit 250 may comprise an OR gate. The output of the edge combiner and reset unit 250 connects to an n-bit counter 258. Counter operation is generally understood and as such, it is not discussed in detail. The counter 258 counts the reference clock pulses provided by an oscillator 262. The oscillator frequency is significantly higher than the tone signal frequency.

The value n may comprise any whole number and the value n may be variable and input to the counter 258 via a counter setting input as shown. Thus, the counter 258 may be programmable. The number of bits in the counter 258 is determined by the process, voltage, and temperature variation expected during manufacture and the rate or other aspect of the oscillator 262.

As shown, the counter 258 receives an oscillator input from an oscillator 262. The oscillator 262 serves as the clock for the counter 258. The counter output connects to a maximum value detector 266, which in turn has an output that feeds into the logic element 254. The maximum value detector 266 comprises a logic state machine and is configured to output a high logic level when the counter 258 reaches its maximum value.

The output of the logic element 254 connects to the flip-flop 244 or other latch device. The flip-flop 244 processes the input from the logic element 254 and the comparator 212 and generates a high level output when a tone is present.

In various other embodiments, other elements or devices may be substituted as warranted to enable operation as desired. Thus, the embodiment of FIG. 2 is not limited to these particular elements and arrangements shown.

In operation, if a tone is not present on the input 204, no AC signal is provided to the comparator 212. In turn, the comparator 212 does not output a signal, and the edge detectors 240A, 240B do not detect any edges. As a result, the counter 258 continues to count until it generates a maximum value signal, i.e. an output signal, which is received by the maximum value detector 266. The detector 266 in turn provides an input to the OR logic element 254. If either the input from the maximum value detector 266 or the detector 240A is high, then the OR logic element will output a high level. In this case, the maximum value detector output is high so the OR gate output is high also. But, the output of the comparator 212 is low, so the input to the flip-flop is also low. This results in the output of the flip-flop being low which thereby indicates that a tone is not present on the input 204.

Next, when a tone appears at the input 204, the comparator 212 converts the incoming tone signal to a rail to rail signal on it output which swings between $V_{dd}$ and $V_{ss}$. The comparator output is fed to the edge detector 240A and the inverter 236 and edge detector 240B pair. The comparator output is also clocked in as a high level input to the D input of the flip flop 244.

The rail to rail swing signal from the comparator 212 forces the tone detector output to go high, thereby indicating the receipt of the tone at the input 204. Concurrently, the edge detectors 240A, 240B detect the rising and falling edges, respectively, of the comparator output.

Upon detection of a rising edge, the edge detector 240A, 240B outputs a signal or pulse to the edge combiner and reset unit 250, which in turn generates a reset signal to the counter 258. The reset signal forces the counter 258 to reset, which in turn prevents the counter from reaching its maximum output value. Consequently, the maximum value detector 266 does not detect the maximum value and does not output a high logic level to the OR gate 254.

As long as the tone is continually received at the input 204, the flip flop 244 output will likewise remain high thereby indicating a tone is at the input. If the duty cycle of the rail to rail tone signal at the output of the comparator is 50%, the counter 258 needs to count for a few oscillator cycles past half the tone period. If the comparator output is not at 50% duty cycle, then the counter 258 must be able to count a few oscillator cycles more than the larger portion of the cycle or the larger timing between the rising and falling tone edges.

If the tone ceases at the input 204, then the comparator 212 will cease to generate a rail to rail output signal and thus the input to the flip flop 244 will be zero. In turn, the edge detectors 240A, 240B will not sense rising edges and the counter 258 will not be reset and will reach and output its maximum value. The maximum value detector 266 detects this maximum value and generates an input to the OR gate 254, which in turn toggles the flip flop 244 to clock in the zero level at the D input. This in turn forces the flip flop output to logic level zero indicating the tone is no longer present.

Figure 2A:
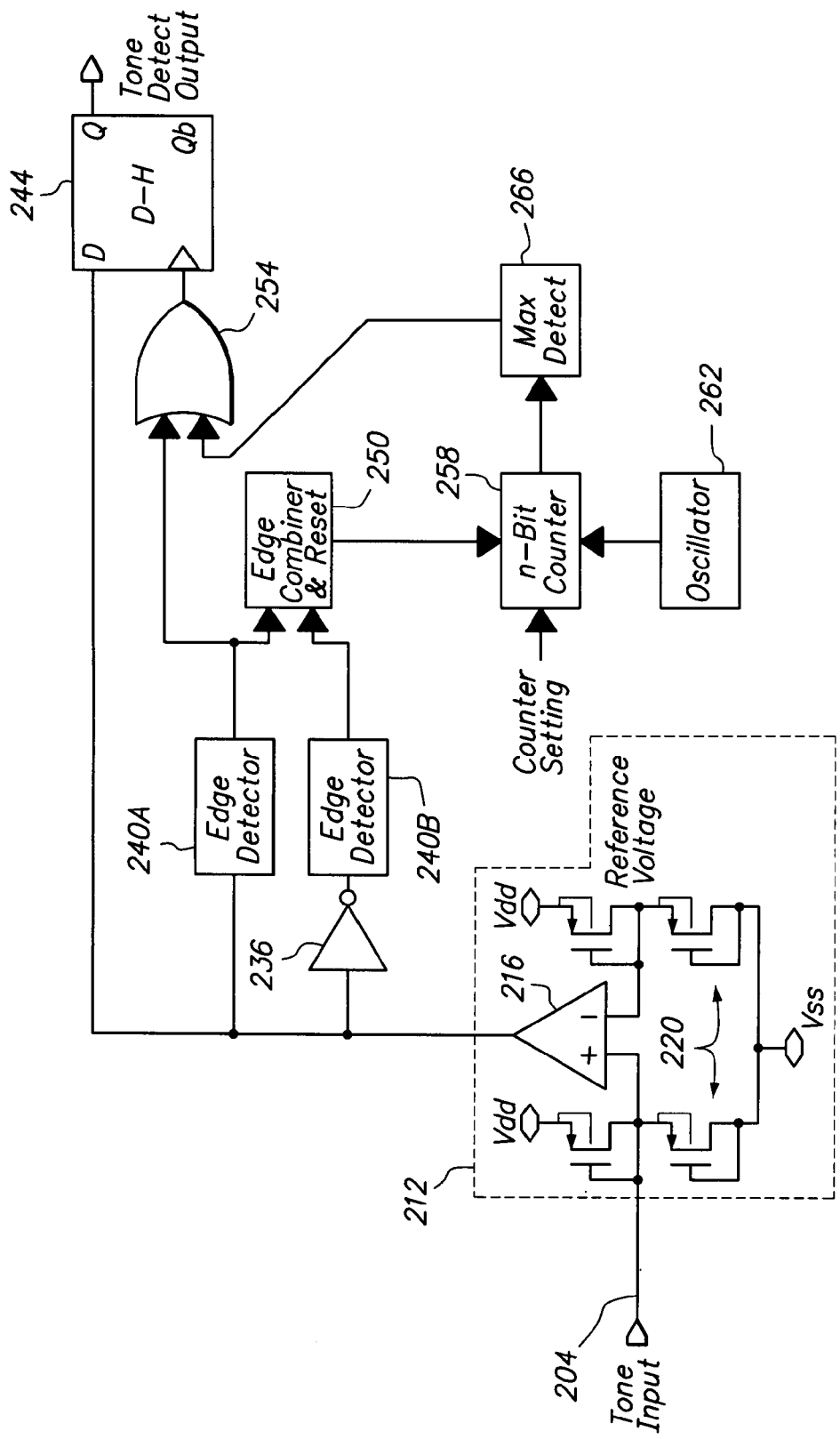
FIG. 2A illustrates an exemplary circuit diagram of an example embodiment of a tone detector.
Figure 2B:
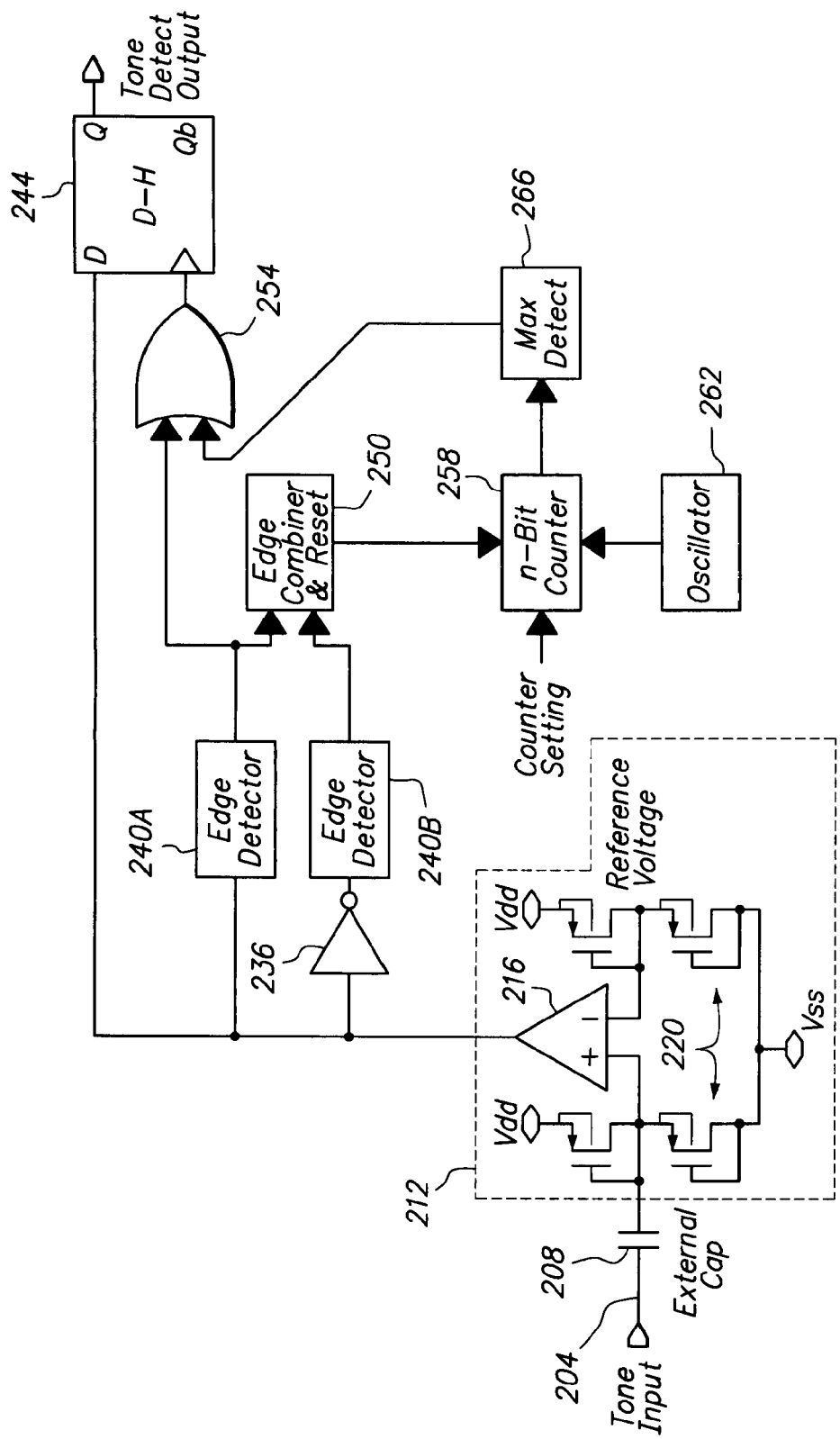
FIG. 2B illustrates an exemplary circuit diagram of an example embodiment of a tone detector with an input capacitor.

Numerous other embodiments and configurations are possible. One such example embodiment is shown in FIG. 2B. As compared to FIG. 2A, identical reference numbers are utilized to reference similar or identical elements. As shown, a capacitor 208 is located between the tone input 204 and the comparator 212. In this embodiment, the capacitor 208 is selected to remove the DC offset, if present, from the received signal. It is contemplated that the capacitor may be internal, such as integrated monolithic, or an external (off-die) capacitor.

Figure 2C:
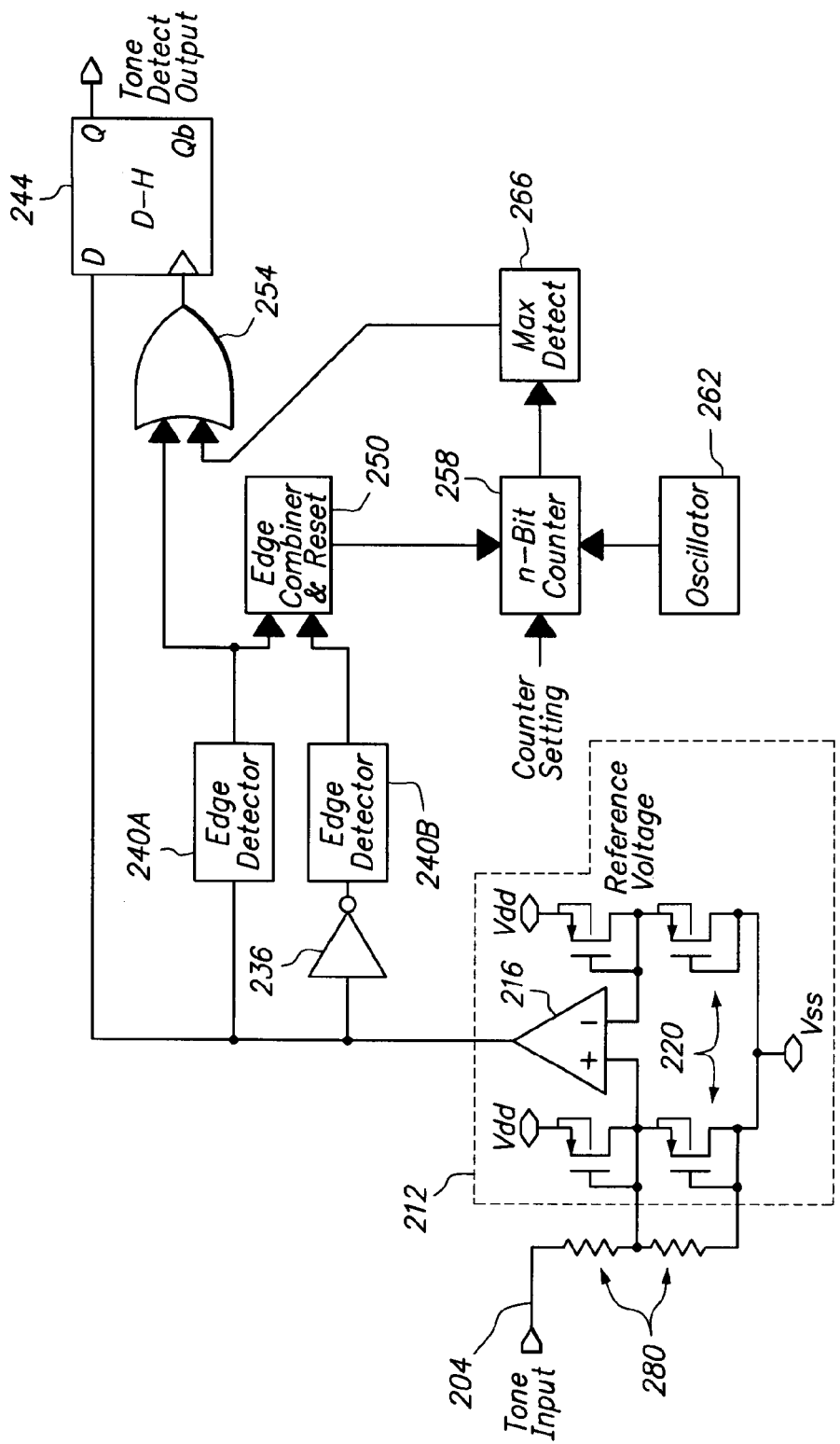
FIG. 2C illustrates an exemplary circuit diagram of an example embodiment of a tone detector with a voltage divider at the tone input.

FIG. 2C illustrates an exemplary circuit diagram of an example embodiment of a tone detector with a voltage divider 280 at the tone input. As compared to FIG. 2A, identical reference numbers are utilized to reference similar or identical elements. In this embodiment the divider network is located between the input 204 and the comparator 212. The voltage divider network 280 may comprise one or more resistors as shown which are selected and arranged to reduce the input signal power or voltage level. By way of example, if the input signal exhibits an unwanted DC component, the input signal may be divided down using any known circuit, such as the resistor divider network as shown. Additional components may be utilized in the voltage divider 280 as would be understood by one of ordinary skill in the art. The voltage divider 280 may be internal or external to the integrated circuit containing the other components shown in FIG. 2C.

By way of example and not limitation, if the input signal includes an 18 volt DC offset, dividing the input voltage by a value n results in 18V/n and if the desired voltage swing is from 400 mV to 600 mV, then the divide value of n may be selected accordingly, namely n=12 for 3V supply.

Figure 2D:
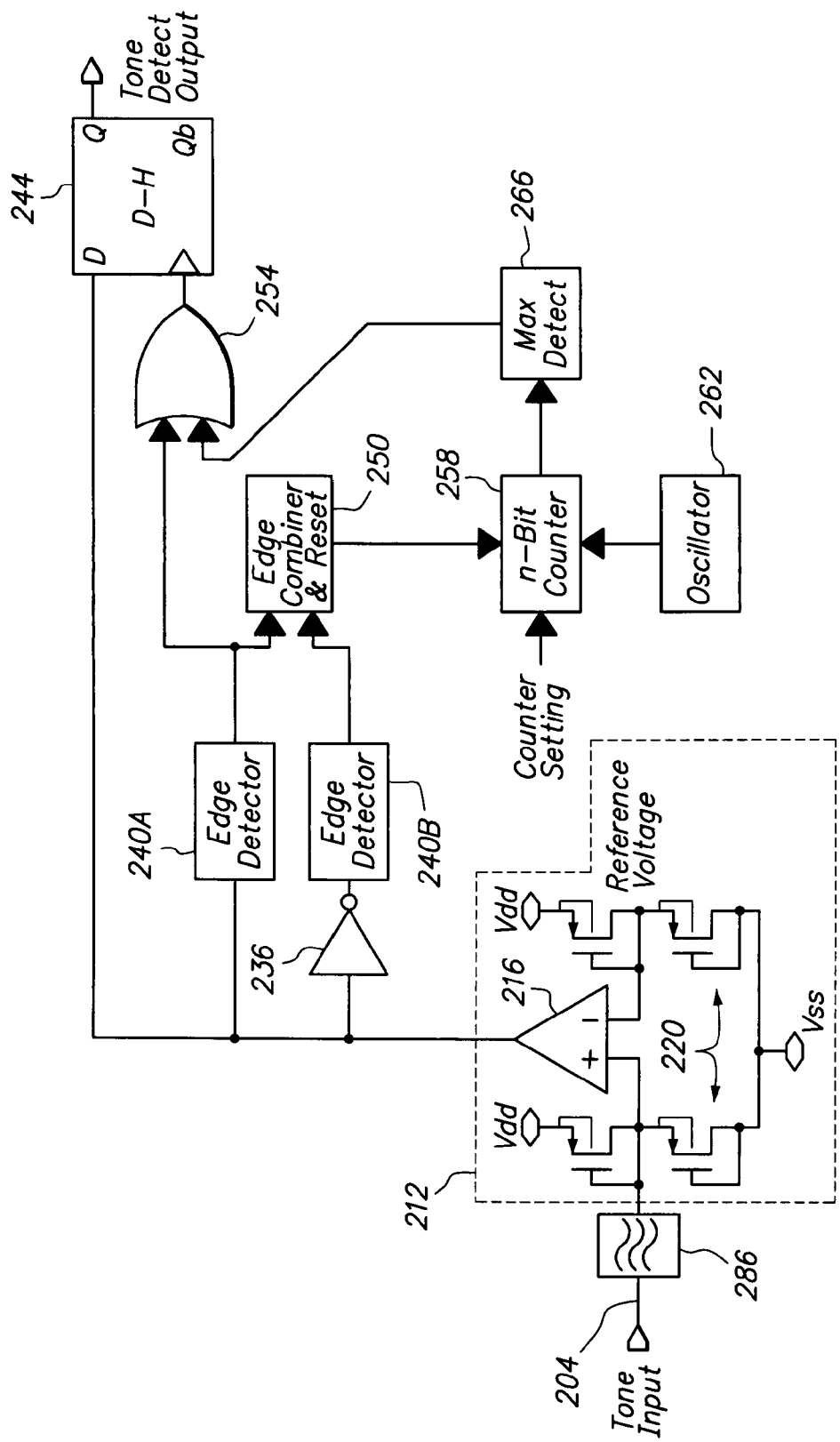
FIG. 2D illustrates an exemplary circuit diagram of an example embodiment of a tone detector with a filter at the tone input.

FIG. 2D illustrates an exemplary circuit diagram of an example embodiment of a tone detector with a filter 286 at the tone input. As compared to FIG. 2A, identical reference numbers are utilized to reference similar or identical elements. The filter 286 is located between the input 204 and the comparator 212. Any type filter 286 may be adopted for use, such as an integrated filter. The filter 286 may be utilized in either a continuous time or switched-capacitor implementation. The filter 286 can be tailored to selectively pass the wanted tone at the input and reject unwanted frequencies and noise, which may otherwise interfere with desired operation.

It is also contemplated that these features shown in FIGS. 2A through 2D may be combined or enabled in any combination to achieve the one or more benefits of such features in combination, as described herein.

Turning now to FIG. 3, multiple signal plots for signals generated by and within the example embodiment of FIG. 2 are shown. In these plots, time is shown on the horizontal axis 304 while voltage is shown on the vertical axis 308 for each plot. Plot A through Plot I, labeled on the right hand side of FIG. 3, are shown from bottom to top. Plot A represents the input signal after processing by the comparator. As can be seen, the signal in Plot A swings rail to rail when a tone is present. In this example plot, a 20 KHz sinusoidal is applied at the tone input for three cycles lasting 150 microseconds followed by no tone signal for 100 microseconds.

Plot B represents the reset signal generated by edge comparator and reset unit. A pulse is present at each rising and falling edge of the comparator output. When a tone is not present, the edge comparator does not generate any pulses.

Plot C through Plot G represent the outputs of the counter for various n values. The value n accommodates variation in duty cycle and drift of the free-running oscillator eliminating the need for a full PLL. For n=5, (shown in plot G), the counter is reset before it reaches its maximum value. As can be seen, when the tone input ends, the counter continues to count and reaches its maximum count value which results in the flip flop generating a high level output.

Next, Plot H shows the maximum value detector output, which generates or serves as a clocking input for the flip flop. This shows that the maximum value detector is generating an output when the counter reaches its maximum value. The D input to the flip flop is the signal shown in plot A, so the counter out signal in Plot H clocks in a zero, which indicates the end of the tone signal which is shown as the output in plot I.

There is a small delay between the first rising edge of the tone signal and that of the tone detect output shown in plot I. In this example embodiment, the delay between the last tone period to the falling edge of the output signal in plot I is only about 37 micro seconds for n=5 and even less for n=4, which is sufficient and may be optimal depending on other design parameters.

FIG. 4 illustrates multiple signal plots for signals generated by and within the example embodiment of FIG. 2. In FIG. 4 horizontal axis 304 represents time while the vertical axis 308 represents voltage. In FIG. 4, the simulation results are repeated over 10 tone cycles and a longer time with no tone signal. Plot A through Plot I represent longer cycles of the plots shown in FIG. 3. As can be appreciated, the circuit performs as intended based on the test result plots shown in FIG. 4. The circuit of FIG. 2 operates as expected for any number of the one clock cycles and any duration of no tone signals.

In this application, power is not an issue and as such, the counter can operate during the time when no tone is present. If power is at issue, it is contemplated that the counter can be powered down at the first counter out pulse, which signals the end of the tone signal. The counter can then be re-energized at the first reset signal generated by the first rising edge of the tone signal.

Figure 5:
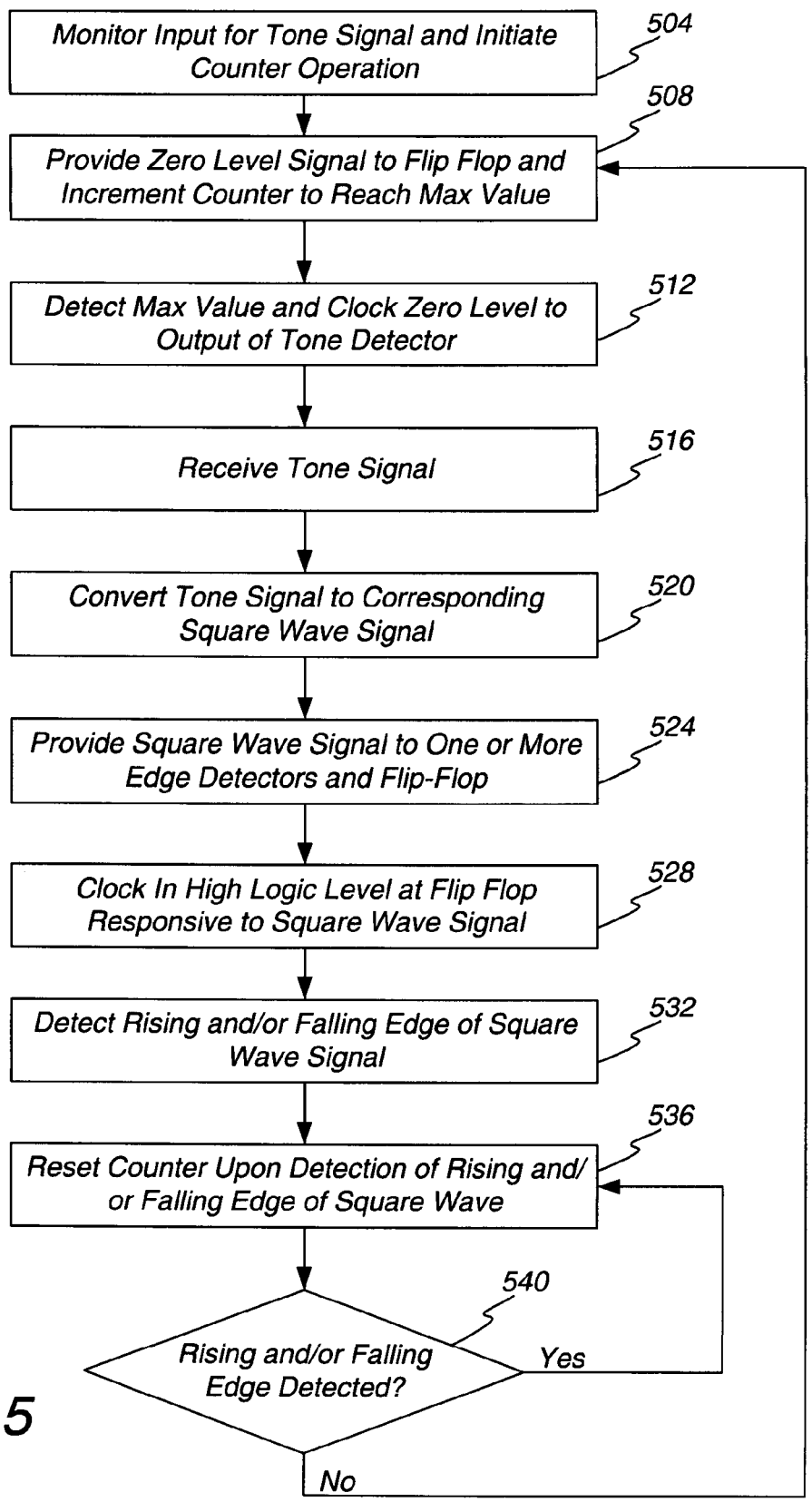
FIG. 5 illustrates an operational flow diagram of an example method of operation of the invention disclosed herein.

FIG. 5 illustrates an operational flow diagram of an example method of operation. This is but one possible method of operation and as such, it is contemplated that one of ordinary skill in the art may derive other methods of operation which do not depart from the claims that follow. The method begin operation at a steady state mode when a tone is not present. At a step 504, the system monitors for a tone signal and initiates counter operation. Thereafter or concurrently, at a step 508, the system routes the zero level input signal (no tone present) to the flip flop and continues to increment the counter causing the counter to reach its maximum value.

Next, at a step 512, the system detects the maximum value of the counter and the zero value presented to the flip flop is clocked through the flip flop as a zero level output to the tone detect. Thus, the counter reaching the maximum value clocks the zero level input through the tone detector flip flop thereby forcing the output of the tone detector to zero level, which indicates a tone is not present. This method of operation continues until a tone is detected or received at the tone detector input.

At a step 516, a tone is received. Any type tone may be received. Next, at a step 520, the tone is converted to a corresponding square wave signal. In other embodiments the tone may be converted to any type signal capable of use by subsequent processing elements. In one embodiment the conversion is performed by a comparator. In one embodiment the signal is converted to a digital signal.

Next, at a step 524, the square wave signal is provided to one or more edge detectors and a flip flop. Then, at a step 528, the square wave signal is clocked into a D input of the flip flop and due to the detection of the square wave signal, the flip flop output goes high also, thereby indicating the presence of a tone. This occurs in response to the high level square wave signal, which in turn was responsive to the tone at the input of the tone detector.

At a step 532, the signal that was provided to the edge detectors is processed by the edge detectors such that the rising and/or falling edge of the square wave signal is detected. The edge detectors output a reset pulse to the counter, which at step 536 resets the counter. Resetting the counter prevents the counter from reaching its maximum value. Next, at decision step 540, the operation determines if additional rising and/or falling edges are detected (a tone is present). If at decision step 540 an edge is detected, then the operation returns to step 536 and the counter continues to count and be reset prior to reaching its maximum value. Alternatively, if at decision step 540 an edge is not detected, then the operation returns to step 508, which was discussed previously.

While various embodiments of the invention have been described, it will be apparent to those of ordinary skill in the art that many more embodiments and implementations are possible that are within the scope of this invention. In addition, the various features, elements, and embodiments described herein may be claimed or combined alone, or in any combination or arrangement.

What is claimed is:

1. A tone detector comprising:
   a comparator configured to connect to an input, the input intermittently receiving a tone signal, such that the comparator generates a square wave output signal in response to the tone signal;
   one or more edge detectors configured to detect an edge of the square wave output signal and responsive to detection of an edge, generate a reset signal;
   a counter configured to generate a maximum value signal unless reset by receipt of the reset signal prior to reaching the maximum counter value;
   a logic element configured to receive the maximum value signal and an output from the one or more edge detectors and responsive thereto, generate a flip flop clocking signal; and
   a flip flop configured to receive the square wave signal and the flip flop clocking signal and in response output a first signal when a tone signal is not present at the input and a second signal when a tone signal is present at the input.

2. The detector of claim 1 wherein the counter is a programmable counter configured to count to a value n, where the value n is programmable.

3. The detector of claim 1 wherein the flip flop outputs the first signal after the counter outputs the maximum counter value.

4. The detector of claim 1 wherein the one or more edge detectors includes a first edge detector configured to detect a rising edge and a second edge detector configured to detect a falling edge.

5. A tone detector comprising:
   a comparator configured to intermittently receive a tone signal at an input, such that the comparator generates a comparator output signal in response to receipt of the tone signal;
   one or more edge detectors configured to detect an edge of the comparator output signal and, responsive to detection of the edge, generate a reset signal;
   a counter configured to generate a maximum value signal subject to the reset signal;
   a logic element configured to receive the maximum value signal and an output from the one or more edge detectors and responsive thereto, generate a flip flop clocking signal; and
   a flip flop configured to receive the comparator output signal and the flip flop clocking signal, and output a tone detection signal when a tone signal is present at the input.

6. The tone detector of claim 5 wherein the counter is a programmable counter.

7. The detector of claim 5 wherein the flip flop outputs the tone detection signal after the counter outputs the maximum counter value.

8. The detector of claim 5 wherein the one or more edge detectors includes a first edge detector configured to detect a rising edge and a second edge detector configured to detect a falling edge.

9. The detector of claim 5 wherein the comparator output signal is a square wave signal.

10. The detector of claim 5 further comprising an input capacitor located between the input and the comparator.

11. The detector of claim 5 further comprising a filter located between the input and the comparator, the filter configured to selectively reject out of band signals.

12. The detector of claim 5 further comprising a voltage divider network located between the input and the comparator.

13. A tone detector comprising:
   a comparator configured to receive and process an input signal at an input, such that the comparator generates a comparator output signal in response to receipt of the input signal;
   one or more edge detectors configured to detect an edge of the comparator output signal and, responsive to detection of the edge, generate a reset signal;
   a counter configured to generate a counter output signal subject to the reset signal;
   a logic element configured to receive the counter output signal and an output from the one or more edge detectors and responsive thereto, generate either a flip flop clocking signal or a latch element clocking signal; and
   a flip flop or latch element configured to receive the comparator output signal and either the flip flop clocking signal or the latch element clocking signal, and output a detection signal when a signal is present at the input.

14. The tone detector of claim 13 wherein the counter is a programmable counter.

15. The detector of claim 13 wherein the one or more edge detectors includes a first edge detector configured to detect a rising edge and a second edge detector configured to detect a falling edge.

16. The detector of claim 13 wherein the comparator output signal is a square wave signal.

17. The detector of claim 13 further comprising an input capacitor located between the input and the comparator.

18. The detector of claim 13 further comprising a filter located between the input and the comparator, the filter configured to selectively reject out of band signals.

19. The detector of claim 13 further comprising a voltage divider network located between the input and the comparator.

* * * * *